US009323151B2

(12) United States Patent
Sun et al.

(10) Patent No.: US 9,323,151 B2
(45) Date of Patent: Apr. 26, 2016

(54) PHOTOSENSITIVE OLIGOMER FOR PHOTOSENSITIVE RESIST, METHOD FOR PREPARING THE SAME, AND NEGATIVE PHOTOSENSITIVE RESIST RESIN COMPOSITION

(71) Applicant: BOE TECHNOLOGY GROUP CO., LTD., Beijing (CN)

(72) Inventors: Wenwen Sun, Beijing (CN); Zhuo Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 4 days.

(21) Appl. No.: 14/348,489

(22) PCT Filed: Jun. 3, 2013

(86) PCT No.: PCT/CN2013/076670
§ 371 (c)(1),
(2) Date: Mar. 28, 2014

(87) PCT Pub. No.: WO2014/134881
PCT Pub. Date: Sep. 12, 2014

(65) Prior Publication Data
US 2015/0153645 A1    Jun. 4, 2015

(30) Foreign Application Priority Data

Mar. 7, 2013 (CN) .......................... 2013 1 0072295

(51) Int. Cl.
| C08F 8/14 | (2006.01) |
| G03F 7/038 | (2006.01) |
| C08F 220/06 | (2006.01) |
| C08F 220/10 | (2006.01) |
| C08F 8/42 | (2006.01) |
| G03F 7/004 | (2006.01) |
| G02B 5/23 | (2006.01) |
| G02B 1/00 | (2006.01) |

(52) U.S. Cl.
CPC ............... *G03F 7/0388* (2013.01); *C08F 8/14* (2013.01); *C08F 8/42* (2013.01); *C08F 220/06* (2013.01); *C08F 220/10* (2013.01); *G02B 1/00* (2013.01); *G02B 5/23* (2013.01); *G03F 7/004* (2013.01); *G03F 7/038* (2013.01)

(58) Field of Classification Search
None
See application file for complete search history.

(56) References Cited

U.S. PATENT DOCUMENTS

| 4,250,240 | A | * | 2/1981 | Shimada et al. | 430/66 |
| 4,282,301 | A | * | 8/1981 | Ohta | 430/175 |
| 4,407,899 | A | * | 10/1983 | Hara et al. | 428/626 |
| 4,477,536 | A | * | 10/1984 | Wright et al. | 428/522 |
| 4,888,383 | A | * | 12/1989 | Huybrechts | 524/832 |
| 4,933,214 | A | * | 6/1990 | Sugiura et al. | 427/379 |
| 5,153,102 | A | * | 10/1992 | Lee et al. | 430/284.1 |
| 5,348,998 | A | * | 9/1994 | Ito et al. | 524/190 |
| 5,428,107 | A | * | 6/1995 | Tysak et al. | 525/102 |
| 5,436,307 | A | * | 7/1995 | Katsushima | 526/279 |
| 5,707,782 | A | * | 1/1998 | Economy et al. | 430/285.1 |
| 5,840,806 | A | * | 11/1998 | Komazaki et al. | 525/101 |
| 6,255,034 | B1 | * | 7/2001 | Shimada et al. | 430/281.1 |
| 6,410,206 | B1 | * | 6/2002 | Ueda et al. | 430/280.1 |
| 6,432,614 | B1 | * | 8/2002 | Ueda et al. | 430/281.1 |
| 2003/0149227 | A1 | * | 8/2003 | Okazaki | 528/310 |
| 2005/0124747 | A1 | * | 6/2005 | Murase et al. | 524/492 |
| 2012/0004341 | A1 |  | 1/2012 | Kim et al. |  |
| 2014/0158954 | A1 | * | 6/2014 | Lun et al. | 252/586 |

FOREIGN PATENT DOCUMENTS

| CN | 1877449 A | 12/2006 |
| CN | 102344525 A | 2/2012 |
| CN | 103145555 A | 6/2013 |

OTHER PUBLICATIONS

International Search Report Issued Dec. 19, 2013; Appln. No. PCT/CN2013/076670.
First Chinese Office Action Issued Jul. 14, 2014; Appln. No. 201310072295.9.
Second Chinese Office Action dated Jan. 5, 2015; Appln. No. 201310072295.9.
International Preliminary Report on Patentability Appln. No. PCT/CN2013/076670; Dated Sep. 8, 2015.

* cited by examiner

*Primary Examiner* — Robert S Loewe
(74) *Attorney, Agent, or Firm* — Ladas & Parry LLP

(57) ABSTRACT

A photosensitive oligomer for photosensitive resist comprising unsaturated double-bond group and flexible group. The monomers or compounds for synthesizing the photosensitive oligomer include unsaturated double-bond containing organic acid-based monomers, unsaturated double-bond containing organic ester-based monomers, unsaturated double-bond containing organic acid chloride/ethylene-based monomers, unsaturated double-bond containing alcohol-based compounds, and flexible group-containing silane/ether-based compounds. The present invention further provides a negative photosensitive resist resin composition comprising the photosensitive oligomer.

12 Claims, No Drawings

PHOTOSENSITIVE OLIGOMER FOR PHOTOSENSITIVE RESIST, METHOD FOR PREPARING THE SAME, AND NEGATIVE PHOTOSENSITIVE RESIST RESIN COMPOSITION

INVENTION FIELD

The embodiments of the present invention relate to a photosensitive oligomer for photosensitive resist, a method for preparing the same, and a negative photosensitive resist resin composition comprising the photosensitive oligomer.

BACKGROUND

Color filter is an essential component of liquid crystal display, and the technology associated with color filter is key technology which must be in hand. The technical keys of color filters rely on the development of red, green, blue pigmented photosensitive resists and the coating process thereof. In accordance with the chemical reaction mechanism and the developing principles of photosensitive resists, photosensitive resists can be divided into two classes, that is, negative and positive photosensitive resists. The negative photosensitive resists undergo chemical reaction to generate insoluble materials after light radiation. In contrast, the positive photosensitive resists per se are insoluble in certain solvents, but will become soluble materials after light radiation.

The coating principle of negative photosensitive resists involves: (1) a photosensitive resin (i.e., a photosensitive resist) is first coated onto the surface of an object to be processed, such as, glass substrate; (2) the resin coating is coated with a desired processing pattern (together with a masking plate), and then undergoes light exposure; (3) the exposed portion of the resin coating undergoes chemical crosslinking reaction so that the exposed and unexposed portion of the resin exhibit difference in terms of developing properties due to the change of their chemical structures. In other words, after light exposure and development with an appropriate developer, the unexposed portion is washed away, and the exposed portion is retained, thereby forming patterns oppose to the masking plate, and producing the negative photosensitive resists.

However, during the practical experiments and applications, it tends to find that rugged, unsmooth or caked phenomena appear on the surface of patterns formed by photosensitive resists after light exposure, development, or post-baking. Thus, there is a need of further researching and screening the components of negative photosensitive resist resin composition so as to address problems including surface defects and the like.

SUMMARY OF INVENTION

The embodiment of the present invention provides a photosensitive oligomer for photosensitive resist which exhibits superior properties.

Another embodiment of the present invention provides a method of preparing a photosensitive oligomer for photosensitive resist.

Yet another embodiment of the present invention provides a negative photosensitive resist resin composition comprising a photosensitive oligomer for photosensitive resist.

In one aspect, the present invention provides a photosensitive oligomer for photosensitive resist comprising unsaturated double-bond group and flexible group. Monomers or compounds for synthesizing the photosensitive oligomer comprise unsaturated double-bond group and flexile group.

Monomers or compounds for synthesizing the photosensitive oligomer are selected from the group consisting of unsaturated double-bond containing organic acid-based monomers, unsaturated double-bond containing organic ester-based monomers, unsaturated double-bond containing organic acid chloride/ethylene-based monomers, unsaturated double-bond containing alcohol-based compounds, and flexible group-containing silane/ether-based compounds.

Among others, the unsaturated double-bond containing organic acid chloride/ethylene-based monomers refer to organic acid chloride-based monomers comprising unsaturated double-bond or ethylene-based monomers comprising unsaturated double-bond, wherein the ethylene-based monomers comprising vinyl group capable of taking part in polymerization. The flexible group-containing silane/ether-based compounds refer to silane-based compounds and ether-based compounds, both of which comprise flexible group.

Among other, the photosensitive oligomer has a weight-average molecular weight of 500 to 5000, such as, 1000 to 2500.

The amounts of the monomers or compounds for synthesizing the oligomer are:

unsaturated double-bond containing organic acid-based monomers 15 to 35 parts by weight;

unsaturated double-bond containing organic ester-based monomers 10 to 20 parts by weight;

unsaturated double-bond containing organic acid chloride/ethylene-based monomers 50 to 80 parts by weight;

unsaturated double-bond containing alcohol-based compounds 10 to 20 parts by weight; and flexible group-containing silane/ether-based compounds 3-20 parts by weight.

For instance, the amounts can be:

unsaturated double-bond containing organic acid-based monomers 20 to 30 parts by weight;

unsaturated double-bond containing organic ester-based monomers 15 to 20 parts by weight;

unsaturated double-bond containing organic acid chloride/ethylene-based monomers 65 to 75 parts by weight;

unsaturated double-bond containing alcohol-based compounds 10 to 15 parts by weight; and flexible group-containing silane/ether-based compounds 10 to 15 parts by weight.

In one aspect, the photosensitive oligomer for photosensitive resist is synthesized in line with the following manners: Polymerizing the unsaturated double-bond containing organic acid-based monomers, the unsaturated double-bond containing organic ester-based monomers, and the organic acid chloride/ethylene-based monomers at a temperature of 50 to 80° C. and in the presence of a polymerization initiator for 4 to 7 hours; then adding a polymerization inhibitor, and cooling the reaction mixture to a temperature of 40 to −60° C.; followed by adding the unsaturated double-bond containing alcohol-based compounds and the flexible group-containing silane/ether-based compounds for reaction.

The unsaturated double-bond (also known as polymerizable double-bond, unsaturated bond) containing organic acid-based monomers have at least one acidic group and at least one polymerizable double-bond group. For instance, the acidic group can be carboxylic acid group. The examples of the unsaturated double-bond containing organic acid-based monomers can be unsaturated carboxylic acid compound having double-bond between conjugated carbons and carboxyl group. The substituents of the organic acid-based monomers are not limited. The specific examples of the organic acid-based monomers (b-2) comprises, without limitation, one or more selected from the group consisting of (meth)acrylic acid, crotonic acid, cinnamic acid, isocinnamic acid, α-methylcinnamic acid, and maleic acid.

The (meth)acrylic acid refers to methacrylic acid or acrylic acid, and comprises derivatives of (meth)acrylic acid. Other unsaturated carboxylic acid compounds comprise the derivatives thereof.

The unsaturated double-bond containing organic ester-based monomers (b-1) can be one or more selected from the group consisting of methyl acrylate, methyl butenoate, methyl methacrylate, ethyl methacrylate, propyl methacrylate, butyl methacrylate, isobutyl methacrylate and isopentyl acrylate. The unsaturated double-bond containing organic ester-based monomers have at least one polymerizable double-bond group and at least one ester functional group. The examples of the organic ester-based monomers can be one or more selected from the group consisting of (meth)acrylates or its derivatives, and comprise, without limitation, methyl(meth)acrylate, ethyl(meth)acrylate, propyl(meth)acrylate, butyl(meth)acrylate, isobutyl(meth)acrylate and isopentyl acrylate. The (meth)acrylates refer to acrylates and methacrylates. The methyl(meth)acrylate refer to methyl acrylate and methyl methacrylate.

The unsaturated double-bond containing organic acid chloride/ethylene-based monomers (b-3) can be one or more selected from the group consisting of styrene, butadiene, maleic acid (MA), ethyl acrylic acid chloride, acrylic acid chloride, and isobutyl acrylic acid chloride.

The ethylene-based monomers refer to olefin-based monomers comprising at least one double-bond. The examples of the ethylene-based monomers comprise, without limitation, styrene, butadiene, maleic acid, vinyl ether, vinyl acetate, and the derivatives thereof.

The unsaturated double-bond containing organic acid chloride-based monomers comprise at least one polymerizable double-bond group and at least one acid chloride group. The examples of the organic acid chloride-based monomers comprise, without limitation, (meth)acrylic acid chloride and the derivatives thereof. For instance, the organic acid chloride-based monomers comprise one or more selected from the group consisting of (meth)acrylic acid chloride, 2-ethylacrylic acid chloride, 2-isobutylacrylic acid chloride. The (meth)acrylic acid chloride and the derivatives thereof refer to acrylic acid chlorides and the derivatives thereof, as well as methacrylic acid chlorides and the derivatives thereof.

The unsaturated double-bond containing alcohol-based compounds comprise at least one hydroxy group and at least one polymerizable double-bond group. For instance, the alcohol-based compounds can be allyl alcohol, dipentylenetriol or triethylenediol.

The flexible group containing compounds have at least one flexible group and at least one functional group capable of reacting with the oligomer pendant group. The flexible group comprises, without limitation, silyl group, and ether group. For instance, the flexible group containing compounds can comprise silane-based compounds, and ether-based compounds (b-5).

The examples of the ether compounds comprise, without limitation, propylene glycol monomethyl ether acetate, diethylene glycol dimethyl ether, anisole, etc.

The silane-based compounds can be one or more selected from the group consisting of (N,N-diphenylethyl-3-aminopropyl)trimethoxysilane, 1,3-bis(trimethylsilyl)urea, 3-(3-aminophenoxy)propyltrimethoxysilane, 3-aminophenylpropyltriethoxysilane, 3-aminophenylpropyltrimethoxysilane, 3-aminopropylbenzyldiethoxysilane, N,N-bis(3-chloro-2-hydroxyphenylpropyl)aminopropyltriethoxysilane, N,N-dimethylaminochlorodiphenylsilane, tri(dimethylamino)silane, trihexylazidosilane, bis(trimethoxysilylpropyl)amine, and the like.

In one aspect, the photosensitive oligomer structural unit comprises flexible group and polymerizable group, and can be prepared, such as, by the steps of:

1) polymerizing unsaturated double-bond containing organic acid-based monomers, unsaturated double-bond containing organic ester-based monomers, and unsaturated double-bond containing organic acid chloride/ethylene-based monomers at a temperature of 50 to 80° C. and in the presence of polymerization initiator for 4 to 7 hours; and 2) then adding a polymerization inhibitor and cooling the reaction mixture to a temperature of 40 to 60° C., followed by adding unsaturated double-bond containing alcohol-based compounds and flexible group-containing silane/ether-based compounds for reaction, wherein the polymerization initiator is 2,2'-azobis-2-methylbutyrnitrile, dimethyl azodiisobutyrate, azodiisoheptyrnitrile in an amount of 0.5 to 5 parts by weight.

For instance, the organic acid-based monomers (b-2) comprise, without limitation, one or more selected from the group consisting of (meth)acrylic acid, crotonic acid, cinnamic acid, isocinnamic acid, α-methylcinnamic acid, and maleic acid in an amount of 15 to 35 parts by weight, such as, 20 to 30 parts by weight.

For instance, the organic ester-based monomers comprise, without limitation, one or more selected from the group consisting of methyl(meth)acrylate, ethyl(meth)acrylate, propyl(meth)acrylic acid, butyl(meth)acrylic acid, isobutyl(meth)acrylic acid or isopentyl acrylate in an amount of 10 to 20 parts by weight, such as, 15 to 20 parts by weight.

For instance, the organic acid chloride/ethylene-based monomers (b-3) comprise, without limitation, one or more selected from the group consisting of styrene, butadiene, maleic acid (MA), ethyl acrylic acid chloride, acrylic acid chloride or isobutyl acrylic acid chloride in an amount of 50 to 80 parts by weight, such as, 65 to 75 parts by weight.

The polymerization inhibitor comprise, without limitation, at least one selected from the group consisting of p-dihydroxybenzene, 2-sec-butyl-4,6-dinitrophenol, p-tert-butyl-o-dihydroxybenzene, 2,5-di-tert-butyl-p-dihydroxybenzene in an amount of 0.5 to 3 parts by weight.

For instance, the alcohol-based compounds comprise, without limitation, allyl alcohol, dipentylenetriol or triethylenediol in an amount of 10 to 20 parts by weight, such as, 10 to 15 parts by weight.

For instance, the ether-based compounds comprise, without limitation, propylene glycol monomethyl ether acetate, diethylene glycol dimethyl ether, anisole, and the like. The silane-based compounds can be one or more selected from the group consisting of (N,N-diphenylethyl-3-aminopropyl)trimethoxysilane, 1,3-bis(trimethylsilyl)urea, 3-aminophenylpropyltriethoxysilane, 3-aminophenylpropyltrimethoxysilane, 3-aminopropylbenzyldiethoxysilane, N,N-bis(3-chloro-2-hydroxyphenylpropyl)aminopropyltriethoxysilane, N,N-dimethylaminochlorodiphenylsilane, tri(dimethylamino)silane, trihexylazidosilane, bis(trimethoxysilylpropyl)amine and the like in an amount of 3 to 20 parts by weight, such as, 10 to 15 parts by weight.

Among other, in Step 1), during polymerization, the monomers are first dissolved in an organic solvent selected from the group consisting of propylene glycol monomethyl acetate, ethyl 3-ethoxypropoate, vinyl ethylene glycol ether, ethyl acetate, propyl acetate, and the like.

In Step 2), the alcohol-based compounds and the silane-based/polymerizable ether-based compounds are added in batch. For instance, five aliquots are added in batch in one-hour intervals.

The photosensitive oligomer in accordance with the embodiments of the present invention has an unsaturated functionality of 3 to 7.

Another embodiment of the present invention further provides a negative photosensitive resist resin composition comprising the photosensitive oligomer.

The negative photosensitive resist resin composition comprises:
alkali-soluble resin 5 to 14.5 parts by weight;
photosensitive oligomer 4 to 10 parts by weight;
photo-initiator 1 to 5.5 parts by weight;
organic solvent 30 to 70 parts by weight; and
pigment 5 to 20 parts by weight.

For instance, the negative photosensitive resist resin composition comprises:
alkali-soluble resin 7 to 12 parts by weight;
photosensitive oligomer 5 to 8 parts by weight;
photo-initiator 2 to 4.5 parts by weight;
organic solvent 40 to 60 parts by weight; and
pigment 10 to 15 parts by weight.

Among others, the alkali-soluble resin can be aromatic acid methyl methacrylate (SB401), tri-functionality water-soluble acrylate, tetra-functionality aqueous aromatic PEA, water-soluble polyethylene glycol diacrylate, or the like.

The photo-initiator comprises at least one selected from the group consisting of Initiator 369, Initiator 379, 2-methyl-1-[4-(methylthio)phenyl]-2-monopholyno propane-1-one, nitro-aniline, anthraquinone, benzophenone, and N-acetyl-4-nitronaphthylamine. Among other, the chemical name of Initiator 369 is 2-phenylbenzyl-2-dimethylamino-1-(4-morpholin-benzyl-phenyl)butanone, and the chemical name of Initiator 379 is 2-(4-methylbenzyl)-2-(dimethylamino)-1-(4-morpholine-phenyl)-1-butanone. The example of the organic solvent is propylene glycol monomethyl acetate (PMA) or ethyl 3-ethoxypropoate.

The desired pigment may be selected in accordance with the color of the color filter, such as, red, green, or blue pigments as well known in the art.

The negative photosensitive resist resin composition in accordance with the embodiments of the present invention may further comprise some other adjuvants, such as, dispersants, leveling agents, defoamers, or the like. The dispersants comprise 0.2 to 5% of the negative photosensitive resist resin composition, based on the total weight of the negative photosensitive resist resin composition; the leveling agents comprise 0.2% to 5% of the negative photosensitive resist resin composition, based on the total weight of the negative photosensitive resist resin composition; and the defoamers comprise 0.1% to 3% of the negative photosensitive resist resin composition, based on the total weight of the negative photosensitive resist resin composition. The aforesaid adjuvants may be those as well known in the art.

During the synthesis of the photosensitive oligomer for photosensitive resist in accordance with the embodiments of the present invention, a flexible functional group, such as, silicone-oxygen group, carbon-oxygen group, carbon-silicone group, or other functional group containing carbon-carbon double group, is added to provide a internal buffering effect for the photosensitive resist after various process steps and avoid the appearance of surface defects. Namely, the incorporation of flexible pendant group into the polymerizable oligomer component of the photosensitive resist can improve the current defects including unsmooth or caked phenomena, alleviate the surface smoothness caused by the reduced film thickness so that the surface formed by the photosensitive resist is smooth and the color shows uniformly.

The negative photosensitive resist resin composition comprising the photosensitive oligomer in accordance with the embodiment of the present invention can be made to a photosensitive resist coating liquid, which is coated onto a transparent substrate and forms the desired patterns having a determined film thickness. After drying, the photosensitive resist coating liquid is subject to light exposure by using UV exposure and a masking mechanism, and then developed with an alkali-soluble solution so as to obtain a developed pattern having regular edges and smooth surface.

DETAILED DESCRIPTION OF INVENTION

The following examples are provided to illustrate the present invention, but do not limit the scope of the invention.

Example 1

Synthesis of Photosensitive Oligomer

Step 1: 120 g propylene glycol monomethyl acetate (PMA, a solvent), 20 g methacrylic acid (MAA), 70 g maleic acid (MA), 15 g methyl acrylate (MAC), and 8 g polymerization initiator 2,2'-azobis-2'-methylbutyronitrile (AMBN) were added into a four-neck flask provided with a condensation tube, a stirrer, a constant pressure drop funnel, and a thermometer under nitrogen protection, and heat to 50° C. for 5 hours. 4 g para-dihydroxybenzene (polymerization inhibitor) was added, and the reaction mixture was cooled to a temperature of 40° C. for use in Step 2.

Step 2: Via the constant pressure drop funnel, a mixture of 3 g allyl alcohol and 10 g N,N-diphenylethyl-3-aminopropyltrimethoxysilane was dropwise added into the reaction system in a manner that five aliquots are added in batch in one-hour intervals, thereby forming a methacrylic acid (MAA)/maleic acid (MA)/methyl acrylate terpolymer having unsaturated double bond and flexible silyl group on the pendant chain. After 7 h of reaction, the reaction mixture was cooled, poured into large amounts of methanol/water (1:1 volume ratio) to form white powders. The precipitates were filtered under reduced pressure, and dried under vacuum for 6 hours, to give the photosensitive oligomer B-1.

As determined via gel permeation chromatography (GPC; solvent: tetrahydrofuran), the photosensitive oligomer has a weight average molecular weight of 2000.

As determined via acid direct titration (the process is: the sample is titrated with a hydrochloride standard solution in ethanol solvent and Methyl Read is used as the indicator), the functionality of amino group is 6.

Example 2

Synthesis of Photosensitive Oligomer

Step 1: 140 g propylene glycol monomethyl acetate (PMA, a solvent), 20 g methacrylic acid (MAA), 60 g styrene, 15 g methyl acrylate (MAC) and 8 g polymerization initiator 2,2'-azobis-2-methylbutyronitrile (AMBN) were added into a four-neck flask provided with a condensation tube, a stirrer, a constant pressure drop funnel, and a thermometer under nitrogen protection, and heat to 60° C. for 5 hours. 4 g para-dihydroxybenzene (polymerization inhibitor) was added, and the reaction mixture was cooled to a temperature of 50° C. for use in Step 2.

Step 2: Via the constant pressure drop funnel, a mixture of 3 g allyl alcohol and 20 g N,N-diphenylethyl-3-aminopropyltrimethoxysilane was dropwise added into the reaction system in a manner that five aliquots are added in batch in one-hour intervals, thereby forming a methacrylic acid/styrene/methyl acrylate terpolymer having double bond, silyl, and hydroxy on the pendant chain. After 6 h of reaction, the reaction mixture was cooled, poured into large amounts of methanol/water (1:1 volume ratio) to form white powders. The precipitates were filtered under reduced pressure, and dried under vacuum for 6 hours, to give the photosensitive oligomer B-2.

As determined via gel permeation chromatography (GPC; solvent: tetrahydrofuran), the photosensitive oligomer has a weight average molecular weight of 1800.

As determined via acid direct titration, the functionality of amino group is 5.

Example 3

Synthesis of Photosensitive Oligomer

Step 1: 120 g propylene glycol monomethyl acetate (PMA, a solvent), 20 g methacrylic acid (MAA), 60 g styrene, 15 g methyl acrylate (MAC) and 8 g polymerization initiator 2,2'-azobis-2-methylbutyronitrile (AMBN) were added into a four-neck flask provided with a condensation tube, a stirrer, a constant pressure drop funnel, and a thermometer under nitrogen protection, and heat to 80° C. for 4 hours. 4 g para-dihydroxybenzene (polymerization inhibitor) was added, and the reaction mixture was cooled to a temperature of 60° C. for use in Step 2.

Step 2: Via the constant pressure drop funnel, a mixture of 3 g allyl alcohol, 15 g N,N-diphenylethyl-3-aminopropyltrimethoxysilane, and 5 g 3-(3-aminophenoxy) propyltrimethoxysilane was dropwise added into the reaction system in a manner that five aliquots are added in batch in one-hour intervals, thereby forming a methacrylic acid/styrene/methyl acrylate terpolymer having double bond, silyl, and hydroxy on the pendant chain. After 4 h of reaction, the reaction mixture was cooled, poured into large amounts of methanol/water (1:1 volume ratio) to form white powders. The precipitates were filtered under reduced pressure, and dried under vacuum for 6 hours, to give the photosensitive oligomer B-3.

As determined via gel permeation chromatography (GPC; solvent: tetrahydrofuran), the photosensitive oligomer has a weight average molecular weight of 1100.

As determined via acid direct titration, the functionality of amino group is 5.

Photosensitive oligomers B-4 and B-5 were prepared in the same manner as Example 1, namely, Examples 4 and 5. The polymerizable monomers for forming the oligomers as used and their amounts are somewhat different and listed in Table 1.

TABLE 1

Photosensitive Oligomer (Unit: g)

| Photosensitive oligomer | Polymerizable Monomers | | | | | | | Addition Manner | $M_w$ | Unsaturation |
|---|---|---|---|---|---|---|---|---|---|---|
| | (b-1) MAC | (b-4) Propenol | (b-2) MAA | (b-3) SM or MA | (b-5) | | | | | |
| | | | | | b-5-1 | b-5-2 | b-5-3 | | | |
| B-1 | 15 | 15 | 20 | 70 | 10 | | | Continuous | 2000 | 6 |
| B-2 | 15 | 15 | 20 | 60 | 20 | | | Continuous | 1800 | 5 |
| B-3 | 15 | 15 | 20 | 60 | 15 | 5 | | Continuous | 1100 | 5 |
| B-4 | 15 | 15 | 30 | 60 | | | 10 | Continuous | 1500 | 5 |
| B-5 | 15 | 15 | 30 | 60 | | | 10 | Once added | 1200 | 4 |

Note:
Other two polymerizable monomers have a weight ratio of 1:1, and take part in the reaction in an amount of 30% based on the total amount of the aforesaid three monomers.
Among others, continuous addition provides higher utilization ratio of monomers as compared with once addition.
MAA - methacrylic acid
SM - styrene
b-5-1: (N,N-diphenylethyl-3-aminopropyl)trimethoxysilane
b-5-2: 3-(3-aminophenoxy)propyltrimethoxysilane
b-5-3: tri(dimethylamino)silane Examples 6 to 10

Photosensitive oligomers were prepared in the same manner as Example 1, except that the polymerizable monomers and the amounts thereof are listed in Table 2.

ated with UV light, and developed in a developer solution at 23° C. for 2 min. After removal of unexposed portion, the resin layer was washed with water, and then post-baked at 200° C. for 40 min, to give the desired photosensitive resin

TABLE 2

Photosensitive Oligomers (Unit: g)

| photosensitive oligomer | Polymerizable Monomers | | | | | Addition Manner | $M_w$ | unsaturation |
|---|---|---|---|---|---|---|---|---|
| | (b-1) | (b-4) | (b-2) | (b-3) | (b-5) | | | |
| B-6 | 25 g methyl acrylate | 10 g allyl alcohol | 15 g cinnamic acid | 70 g styrene | 10 g bis(trimethoxy-silylpropyl)amine | Continuous | 1800 | 5 |
| B-7 | 25 g methyl methacrylate | 15 g allyl alcohol | 15 g α-methyl cinnamic acid | 70 g ethyl acrylic acid chloride | 10 g 1,3-bis(trimethyl-silyl)urea | Continuous | 1400 | 5 |
| B-8 | 25 g butyl methacrylate | 20 g allyl alcohol | 15 g isocinnamic acid | 70 g isobutyl acrylic acid chloride | 10 g diethylene glycol dimethyl ether | Continuous | 1200 | 4 |
| B-9 | 25 g ethyl methacrylate | 15 g dipentyl-enetriol | 15 g crotonic acid | 60 g acrylic acid chloride | 10 g dipropenyl ethylene glycol methyl ether | Continuous | 1400 | 4 |
| B-10 | 25 g isobutyl methacrylate | 15 g triethyl-enediol | 15 g methacrylic acid | 70 g butadiene | 10 g ethylene glycol monomethyl ether acetate | Continuous | 1500 | 6 |

Experimental Examples 11 to 14

Negative Photosensitive Resist Resin Composition

The photosensitive oligomers synthesized as above (Examples 1 to 5, respectively), alkali-soluble resin SB 401 (available from BASF), Initiator 369 (available from BASF), Pigment C.I.254 were added into a solution of ethyl 3-ethoxypropoate (an organic solvent), mixed with a magnetic stirrer until dissolving, to give a photosensitive resin composition for color filter. The detailed components of the composition are listed in Table 3.

Comparable Examples 1 to 3 are prepared in the same manner as Example 11, and the detailed components are listed in Table. Among others, the oligomer used in Comparable Example 1 is pentaertythritol tetraacrylate, the oligomer used in Comparable Example 2 is bis-pentaertythritol hexaacryliate, and the oligomer used in Comparable Example 3 is propoxylated trihydroxymethylpropane triacrylate.

Evaluation Procedures:

1. Alkali Resistance: The light transmittance of the photosensitive resin layer was measured at a wavelength of 400 to 700 nm, and then measured again at the wavelength of 400 to 700 nm after immersion in 2% aqueous NaOH solution for 5 minutes. In accordance with the difference of the light transmittances, the photosensitive resins were evaluated as follows:
   ○: the difference of the light transmittances is less than 5%;
   □: the difference of the light transmittances ranges from 5 to 10%; and
   x: the difference of the light transmittances is more than 10%.

2. Residua: The photosensitive resin was spin coat to a thickness of 3 μM, pre-baked at temperature for 3 min, radiated with UV light, and developed in a developer solution at pattern. The resultant pattern was observed with electronic micrograph to determine if any residua existed on the surface.
   ○: No residua
   □: A few residua
   x: many residua 3. Surface Smoothness: the pre-determined photosensitive resin pattern was prepared in accordance with the aforesaid procedure 2, and observed with scanning electronic micrograph to determine if the surface was smooth.
   ○: Smooth
   □: A few cracks
   x: Rough The measured results are listed in Table 3.

TABLE 3

Examples, Comparable Examples, and Evaluation Results

| Components (parts by weight) | | Examples | | | | Comparable Examples | | |
|---|---|---|---|---|---|---|---|---|
| | | 4 | 5 | 6 | 7 | 1 | 2 | 3 |
| alkali-soluble resin | A | 100 | 100 | 100 | 100 | 100 | 100 | 100 |
| Polymerizable oligomer | B-1 | 80 | | | | 100 | | |
| | B-2 | | 100 | | | | | |
| | B-3 | | | 80 | | | | |
| | B-4 | | | | 80 | | 100 | |
| | B-5 | | | | | | | 100 |
| photo-initiator | C | 50 | 50 | 50 | 50 | 50 | 50 | 50 |
| pigment | D | 200 | 200 | 200 | 200 | 200 | 200 | 200 |
| organic solvent | E | 800 | 800 | 800 | 800 | 800 | 800 | 800 |
| Evaluation items | Alkali Resistance | ○ | ○ | ○ | ○ | ○ | □ | ○ |

TABLE 3-continued

Examples, Comparable Examples, and Evaluation Results

| Components (parts by weight) | Number | | | | | | |
|---|---|---|---|---|---|---|---|
| | Examples | | | | Comparable Examples | | |
| | 4 | 5 | 6 | 7 | 1 | 2 | 3 |
| Residua | ○ | ○ | ○ | ○ | X | □ | ○ |
| Surface | ○ | ○ | □ | X | ○ | ○ | X |

Conclusion: It can be seen the results in Table 3, the alkali resistance, residua, and surface smoothness of the negative photosensitive resist resin compositions in accordance with the embodiments of the present invention are better than Comparable Examples.

Experimental Examples 15 to 19

Negative Photosensitive Resist Resin Composition

TABLE 4

Evaluation Results of the negative photosensitive resist resin compositions of Examples 15 to 19

| Components (parts by weight) | | Example Number | | | | |
|---|---|---|---|---|---|---|
| | | 15 | 16 | 17 | 18 | 19 |
| alkali-soluble resin | A | 10 g SB401 | 8 g water-soluble polyethylene glycol diacrylate | 10 g SB401 | 10 g tetra-functional aqueous aromatic PEA | 10 g SB401 |
| Polymerizable oligomer | B | 6 g B-6 | 6 g B-7 | 7 g B-8 | 7 g B-9 | 7 g B-10 |
| Photo-initiator | C | 3 g Initiator 369 | 3 g 2-methyl-1-[4-(methyl-thio)phenyl]-2-monofoline propane-1-one | 3 g Initiator 379 | 3 g nitrophenyl amine | 3 g N-acetyl-4-nitronaphthylamine |
| Pigment | D | 15 g C.I.254 | 15 g C.I.254 | 15 g 黄 | 15 g 绿 | 15 g 黄 |
| Organic solvent | E | 66 g PMA | 68 g ethyl 3-ethoxypropoate | 65 g PMA | 65 g PMA | 65 g ethyl 3-ethoxypropoate |
| Evaluation Items | Alkali Resistance | X | ○ | □ | □ | ○ |
| | Residua | □ | ○ | ○ | ○ | ○ |
| | Surface | ○ | ○ | □ | □ | ○ |

Conclusion: It can be seen from Table 4 that the negative photosensitive resist resin compositions comprising the photosensitive oligomer in accordance with the embodiments of the present invention produce patterns having regular edges and smooth surface after made to photosensitive resist coating liquid, light exposed and developed.

Even if the present invention has been hereinbefore described in details by general description and embodiments, it is obvious for persons skilled in the art to make modifications or improvements on the basis of the present invention. Thus, those modifications or improvements made without departing the spirit of the present invention are also encompassed within the present invention.

We claim:

1. A photosensitive oligomer for photosensitive resist comprising unsaturated double-bond group and flexible group, wherein the monomers or compounds for synthesizing the photosensitive oligomer are unsaturated double-bond containing organic acid-based monomers, unsaturated double-bond containing organic ester-based monomers, unsaturated double-bond containing organic acid chloride/ethylene-based monomers, unsaturated double-bond containing alcohol-based compounds, and flexible group-containing silane/ether-based compounds, wherein the amounts of the monomer or compound materials for synthesizing the photosensitive oligomer are:

unsaturated double-bond containing organic acid-based monomers 15 to 36 parts by weight;

unsaturated double-bond containing organic ester-based monomers 10 to 20 parts by weight; unsaturated double-bond containing organic acid chloride/ethylene-based monomers 50 to 80 parts by weight;

unsaturated double-bond containing alcohol-based compounds 10 to 20 parts by weight; and flexible group-containing silane/ether-based compounds 3-20 parts by weight.

2. The photosensitive oligomer for photosensitive resist in accordance with claim 1, wherein the photosensitive oligomer has a weight average molecular weight of 500 to 5000.

3. The photosensitive oligomer for photosensitive resist in accordance with claim 1, wherein the unsaturated double-bond containing organic acid-based monomers are one or more selected from the group consisting of acrylic acid, methacrylic acid, crotonic acid, cinnamic acid, isocinnamic acid and α-methylcinnamic acid.

4. The photosensitive oligomer for photosensitive resist in accordance with claim 1, wherein the unsaturated double-bond containing organic ester-based monomers are one or more selected from the group consisting of methyl acrylate, ethyl acrylate, propyl acrylate, butyl acrylate, isopentyl acrylate, methyl methacrylate, ethyl methacrylate, propyl methacrylate, butyl methacrylate and isobutyl methacrylate.

5. The photosensitive oligomer for photosensitive resist in accordance with claim 1, wherein the unsaturated double-bond containing organic acid chloride/ethylene-based monomers are one or more selected from the group consisting of styrene, butadiene, ethyl acrylic acid chloride, acrylic acid chloride and isobutyl acrylic acid chloride.

6. The photosensitive oligomer for photosensitive resist in accordance with claim 1, wherein the unsaturated double-bond containing alcohol-based compounds are one or more selected from the group consisting of allyl alcohol, dipentylenetriol, triethylenediol, hydroxyethyl acrylate, hydroxyethyl methacrylate, hydroxypropyl acrylate and hydroxypropyl methacrylate.

7. The photosensitive oligomer for photosensitive resist in accordance with claim 1, wherein the flexible group-containing silanes are one or more selected from the group consisting of (N,N-diphenylethyl-3-aminopropyl)trimethoxysilane, 1,3-bis(trimethylsilyl)urea, 3-(3-aminophenoxy)propyltrimethoxysilane, 3-aminophenylpropyltriethoxysilane, 3-aminophenylpropyltrimethoxysilane, 3-aminopropylbenzyldiethoxysilane N,N-bis(3-chloro-2-hydroxyphenylpropyl)aminopropyltriethoxysilane, N,N-dimethylaminochlorodiphenylsilane, tri(dimethylamino)silane, trihexylazidosilane and bis(trimethoxysilylpropyl) amine.

8. The photosensitive oligomer for photosensitive resist in accordance with claim 1, wherein the ether-based compounds are one or more selected from the group consisting of ethylene glycol monomethyl ether acetate, diethylene glycol dimethyl ether, and dipropenylethylene glycol methyl ether.

9. A method of preparing the photosensitive oligomer for photosensitive resist in accordance with claim 1, comprising:
   1) polymerizing the unsaturated double-bond containing organic acid-based monomers, the unsaturated double-bond containing organic ester-based monomers, and the unsaturated double-bond containing organic acid chloride/ethylene-based monomers at a temperature of 50 to 80° C. and in the presence of a polymerization initiator for 4 to 7 hours; and
   2) adding a polymerization inhibitor, and coding the reaction mixture to a temperature of 40 to 60° C., followed by adding the unsaturated double-bond containing alcohol-based compounds and flexible group-containing silane/ether-based compounds for reaction.

10. A negative photosensitive resist composition comprising the photosensitive oligomer in accordance with claim 1.

11. The negative photosensitive resist composition comprising the photosensitive oligomer in accordance with claim 10, comprising:
   alkali-soluble resin 5 to 14.5 parts by weight;
   photosensitive oligomer 4-10 parts by weight;
   photo-initiator 1-5.5 parts by weight;
   organic solvent 30 to 70 parts by weight; and
   pigment 5 to 20 parts by weight.

12. Use of the negative photosensitive resist composition comprising the photosensitive oligomer in accordance with claim 10 in preparation of color filter.

* * * * *